United States Patent
Sip

(10) Patent No.: US 7,928,738 B2
(45) Date of Patent: Apr. 19, 2011

(54) DETECTING SYSTEM FOR DETECTING CONNECTION OF CONNECTORS AND CONNECTOR ASSEMBLIES HAVING SAME

(75) Inventor: Kim-Yeung Sip, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 190 days.

(21) Appl. No.: 12/469,672

(22) Filed: May 20, 2009

(65) Prior Publication Data
US 2010/0164509 A1 Jul. 1, 2010

(30) Foreign Application Priority Data
Dec. 30, 2008 (CN) .......................... 2008 1 0306662

(51) Int. Cl.
*G01R 31/04* (2006.01)
*G01R 31/02* (2006.01)

(52) U.S. Cl. .............. 324/538; 324/750.02; 324/762.06; 439/169; 439/482; 439/489; 702/33

(58) Field of Classification Search .................. None
See application file for complete search history.

(56) References Cited

U.S. PATENT DOCUMENTS

| | | | |
|---|---|---|---|
| 6,768,314 B2 * | 7/2004 | Shimizu et al. | 324/538 |
| 7,271,597 B2 * | 9/2007 | Takano | 324/538 |
| 7,746,090 B1 * | 6/2010 | Sip | 324/762.06 |

* cited by examiner

*Primary Examiner* — Ha Tran T Nguyen
*Assistant Examiner* — Emily Y Chan
(74) *Attorney, Agent, or Firm* — Frank R. Niranjan

(57) ABSTRACT

A detecting system for detecting the connection of two connectors includes a number of first and second linking lines. The detecting system includes a number of first detection switches, a number of pull-down resistors, a number of second detection switches, a number of pull-up resistors, and a detection module. Each first linking line is grounded via each first detection switch and each pull-down resistor in series. The terminals of the pull-down resistors connected to the first detection switches are defined as first detecting ends. Each second linking line is electrically coupled to a high potential via each second detection switch and each pull-up resistors in series. The detection module with a threshold value preset is configured for comparing the voltage value at the first detecting ends with the threshold value, and outputting a result to determine whether the first linking lines are electrically connected to the second linking lines respectively.

20 Claims, 2 Drawing Sheets

DETECTING SYSTEM FOR DETECTING CONNECTION OF CONNECTORS AND CONNECTOR ASSEMBLIES HAVING SAME

BACKGROUND

1. Technical Field

The present disclosure relates to detecting systems and, particularly, to a detecting system for detecting the connection of two connectors and two connector assemblies having same.

2. Description of Related Art

Connectors are widely used in electronic devices such as computer systems for transmitting signals. It is very important to detect if two connectors have been substantially fully mated so that signals can be transmitted between two electronic devices or two components of an electronic device.

The connector generally includes two status pins. The two status pins are shorter than the other pins of the connector. Normally, if the two status pins of the two connectors are connected properly, that means the two connectors are connected completely. However, the two status pins being connected properly only means the connector is mechanical connected, thus user cannot be certain that all pins of the connector is electrically connected properly.

What is needed, therefore, is a detecting system for two connectors to overcome the above-described problem.

BRIEF DESCRIPTION OF THE DRAWINGS

Many aspects of the present detecting system for detecting connection of two connectors can be better understood with reference to the following drawings. The components in the drawings are not necessarily drawn to scale, the emphasis instead being placed upon clearly illustrating the principles of the present detecting system for detecting connection of two connectors and two connector assemblies having same.

DETAILED DESCRIPTION

Embodiments of the present disclosure will now be described in detail below, with reference to the accompanying drawings.

Figure 1:
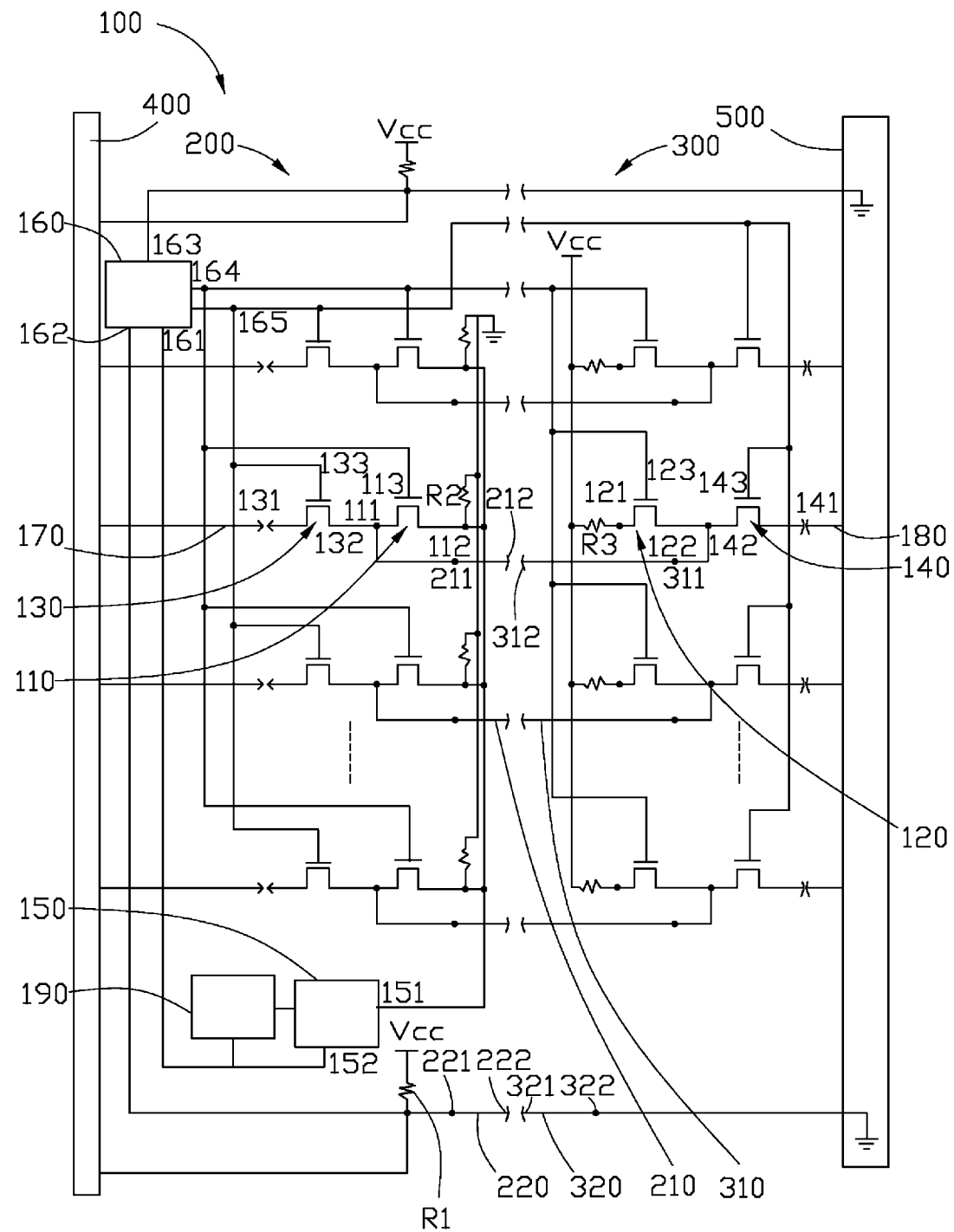
FIG. 1 is a schematic view of a connector assembly including a detecting circuit for detecting the connection of two connectors according to an exemplary embodiment.

Referring to FIG. 1, a detecting system 100 for detecting the connection of a first connector 200 and a second connector 300, according to an exemplary embodiment, is shown. The first connector 200 includes a number of first linking lines 210, two second linking lines 220. The second connector 300 includes a number of third linking lines 310, and two fourth linking lines 320. The first linking lines 210 and the third linking lines 310 are used for transmitting signals. Each of the first linking lines 210 includes a first line input end 211 and a first line output end 212. In the present embodiment, the first connector 200 is a plug. Each third linking line 310 includes a third line input end 311 and a third line output end 312. The third line output end 312 is capable of electrically coupling to the first line output end 212. In the present embodiment, the second connector 300 is a socket. The second linking line 220 and the fourth linking line 320 are used for verifying that the first connector 200 is properly mechanically connected with the second connector 300. In the present embodiment, the two second linking lines 220 are arranged on either side of the first linking lines 210, and the two fourth linking lines 320 are arranged on either side of the third linking lines 310. Each second linking line 220 includes a second linking input end 221 and a second linking output end 222. The second linking input end 221 is electrically connected to a high potential Vcc through a pull-up resistor R1. Each fourth linking line 320 includes a fourth linking input end 321 and a fourth linking output end 322. The fourth linking output end 322 is grounded. The fourth linking input end 321 is electrically connected to the second linking output end 222, when the first connector 200 connects with the second connector 300. In the present embodiment, the second linking output end 222 is a pin, and the fourth linking input end 321 is a pin socket. In the present embodiment, the second linking output end 222 has a length shorter than that of the first line output end 212, so if the second linking output end 222 is properly mechanically connected with the fourth linking input end 321, this reflects that the first linking output end 212 has properly coupled with the third line output end 312 also.

The detecting system 100 includes a number of first detection switches 110, a number of second detection switches 120, a number of first connection switches 130, a number of second connection switches 140, a detection module 150, a controller 160, a number of first signal lines 170, a number of second signal lines 180, and an alarm module 190.

Each first detection switch 110 includes a first detecting input end 111, a first detecting output end 112, and a first detecting control end 113. The first detecting input end 111 is electrically connected to the first line input end 211. The first detecting output end 112 is grounded through a pull-down resistor R2. In the present embodiment, if the first detecting control end 113 receives a high voltage, the first detection switch 110 will close. If the first detecting control end 113 receives a low voltage, the first detection switch 110 will open.

Each second detection switch 120 includes a second detecting input end 121, a second detecting output end 122, and a second detecting control end 123. The second detecting input end 121 is electrically connected to a high potential Vcc through a pull-up resistor R3. The second detecting output end 122 is connected to the third line input end 311. In the present embodiment, if the second detecting control end 123 receives a high voltage, the second detection switch 120 will close. If the second detecting control end 123 receives a low voltage, the second detection switch 120 will open.

Each first connection switch 130 includes a first connecting input end 131, a first connecting output end 132, and a first connecting control end 133. The first connecting output end 132 is coupled to the first line input end 211. In the present embodiment, if the first connecting control end 133 receives a high voltage, the first connection switch 130 will close. If the first connecting control end 133 receives a low voltage, the first connection switch 130 will open.

Each second connection switch 140 includes a second connecting input end 141, a second connecting output end 142, and a second connecting control end 143. The second connecting output end 142 is electrically connected to the third line input end 311. In the present embodiment, if the second connecting control end 143 receives a high voltage, the second connection switch 140 will close. If the second connecting control end 143 receives a low voltage, the second connection switch 140 will open.

The first detection switch 110, the second detection switch 120, the first connection switch 130 and the second connection switch 140 are quick switch. In the present embodiment, the first detection switch 110, the second detection switch 120, the first connection switch 130 and the second connection switch 140 are all bus switches.

The detection module 150 includes a detecting input end 151 and a detecting output end 152. The detecting input end 151 is electrically connected to each first detecting output end 112. A threshold value is preset in the detection module 150, when a current flows from all the first linking lines 210 to all the third linking lines 310, the voltage value of the detecting input end 151 is higher than the threshold value, and then the detection module 150 outputs a high voltage to the detecting output end 152. When a current cannot flow through from all the first linking lines 210 to all the third linking lines 310, the voltage value of the detecting input end 151 is lower than the threshold value, and then the detection module 150 outputs a low voltage to the detecting output end 152.

The first signal line 170 is electrically connected to all the first connecting input ends 131. The second signal line 180 is electrically connected to all the second connecting input ends 141. In the present embodiment, the first signal line 170 is used for receiving signal from a computer 400, and the second signal line 180 is used for receiving signal from a connection duck 500.

The controller 160 includes a first controller input end 161, a second controller input end 162, a third controller input end 163, a first controller output end 164, and a second controller output end 165. The first controller input end 161 is electrically connected to the detecting output end 152. The first controller output end 164 is electrically connected to the first detecting control ends 113 and the second detecting control ends 123. The second controller output end 165 is electrically connected to the first connecting control ends 133 and the second connecting control ends 143.

If the first controller input end 161 receives a high voltage from the detecting output end 152, the first controller output end 164 outputs a low voltage and the second controller output end 165 outputs a high voltage. That is to say, the controller 160 controls the first connection switches 130 and the second connection switches 140 to close, and controls the first detection switches 110 and the second detection switches 120 to open.

If the first controller input end 161 receives a low voltage from the detecting output end 152, the first controller output end 164 outputs a high voltage and the second controller output end 165 outputs a low voltage. That is to say, the controller 160 controls the first connection switches 130 and the second connection switches 140 to open, and controls the first detection switches 110 and the second detection switches 120 to close to form a detecting circuit.

In order to verify that the first line output ends 212 of the first connector 200 and the third line output ends 312 of the second connector 300 are properly coupled to each other, the controller 160 detects whether the second linking output end 222 is properly mechanical connected with the fourth linking input end 321 first. In the present embodiment, the second controller input end 162 and the third controller input end 163 are electrically connected to the second linking input ends 221 respectively. If one of the second controller input end 162 and the third controller input end 163 receives a high voltage, the controller 160 controls the first detection switches 110, the second detection switches 120, the first connection switches 130 and the second connection switches 140 to open.

The alarm module 190 is electrically connected to the detecting output end 152 of the detection module 150. The alarm module 190 is configured for outputting a warning when the alarm module 190 receives a low voltage from the detection module 150. The alarm module 150 can be a buzzer, a light emitting diode(LED), a monitor, or other audio-visual or mechanical alarms. In the present embodiment, if the alarm module 190 receives a low voltage from the detection module 150, the alarm module 190 will output a buzzing sound, turn on an LED or display a warning data image on a display.

When the detecting system 100 is used for detecting the connection state of the first connector 200 and the second connector 300. In order to prevent detecting result from interference due to signal inputted from the first signal line 170 and the second signal line 180, the controller 160 controls the first connection switches 130 and the second connection switches 140 to open first. So signals from the first signal line 170 and the second signal line 180 will not transmit to each other, and the inputted signal will not be lost.

Figure 2:
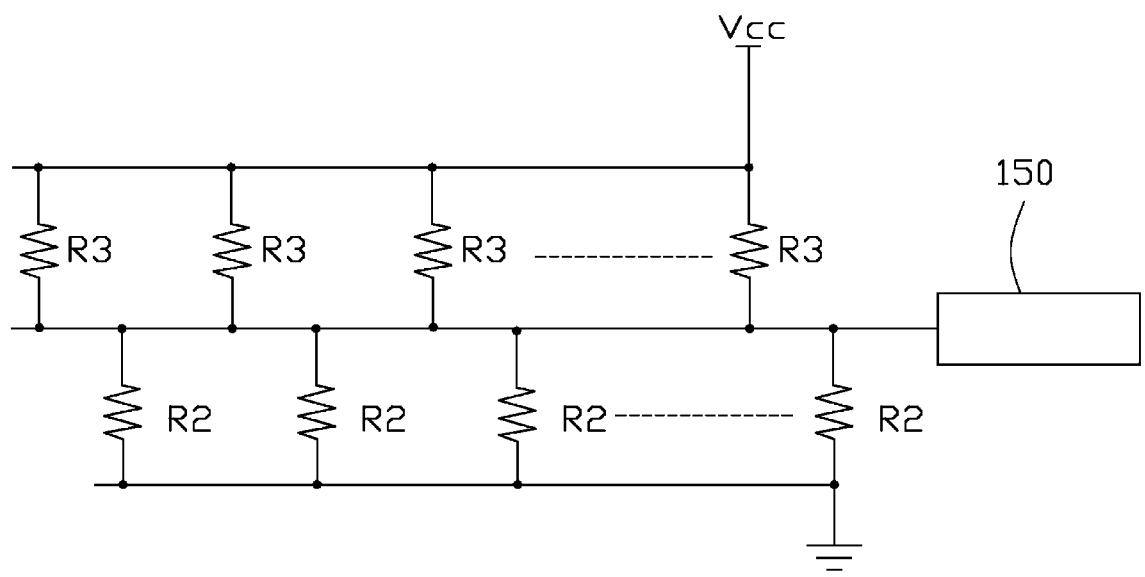
FIG. 2 is an equivalent-circuit diagram of the detecting circuit of the detecting system of FIG. 1.

Then the controller 160 controls the first detection switches 110 and the second detection switches 120 to close to form a detecting circuit. In the detecting circuit, the current from the high potential Vcc flow through the pull-up resistors R3, the second detecting input ends 121, the second detecting output ends 122, the second linking input ends 221, the second linking output ends 222, the first line output ends 212, the first line input ends 211, the first detecting input ends 111, the first detecting output ends 112, the pull-down resistors R2 to the ground. An equivalent-circuit diagram of a detecting circuit of the detecting system 100 for the first connector 200 and the second connector 300 is shown in FIG. 2. The pull-down resistors R2 are connected in parallel by the first detection switches 110, and the pull-up resistors R3 are parallelly connected by the second detection switches 120, and the pull-down resistors R2 are connected with the pull-up resistors R3 in series.

From the equivalent-circuit diagram of the detecting circuit, when current can flow through all lines of the detection circuit, there will be a voltage V in the connection between the pull-down resistors R2 and the pull-up resistors R3. In the present embodiment, the pull-down resistors R2 have equal resistance, and every pull-up resistor R3 is equal. The value of the voltage V can be obtained using the following formula: $V=(R2/n)/(R2/n+R3/n) \times Vcc$. If the first linking lines 210 can not conduct with the third linking lines 310, all of the pull-up resistors R3 can not be connected in the detection circuit. As a result, the voltage V will reduce. The less pull-up resistor R3 connected in the detection circuit, the smaller of the voltage V.

The detecting input end 151 is electrically connected to each first detecting output end 112. In the present embodiment, the threshold value of the detection module 150 is Vt. If any one of the pull-up resistors R3 is not connected in the detection circuit, the threshold value Vt is higher than the voltage V, and the detection module 150 will output a low voltage. Otherwise, the detection module 150 will output a high voltage.

When the detection module 150 outputs a high voltage to the controller 160, the controller 160 sends a low voltage to the first detecting control ends 113 and the second detecting control ends 123. The first detection switch 110 and the second detection switch 120 will open. The pull-down resistors R2 can't connect with the pull-up resistors R3 through the second detecting input ends 121, the second detecting output ends 122, the second linking input ends 221, the second linking output ends 222, the first line output ends 212, the first line input ends 211, the first detecting input ends 111, and the first detecting output ends 112.

Then the controller 160 sends a high voltage to the first connecting control ends 133 and the second connecting control ends 143. The first connection switches 130 and the second connection switches 140 will close. As a result the first signal line 170 will connect with the second signal line 180 through the first connecting input ends 131, the first connecting output ends 132, the first line input ends 211, the first line output ends 212, the second linking output ends 222, the second linking input ends 221, the second connecting output ends 142, and the second connecting input ends 141. If the detection module 150 outputs a low voltage to the controller 160, it means the first linking lines 210 of the first connector 200 and the third linking lines 310 of the second connector 300 are not properly coupled together, the pull-down resistors R2 will not connect with the pull-up resistors R3 either. The alarm module 90 will receives a low voltage from the detection module 150 and outputs the alarm warning.

In the present embodiment, the controller 160 sets the first connecting control ends 133 and the second connecting control ends 143 as a low voltage, and sets the first detecting control ends 113 and the second detecting control ends 123 as a high voltage at first. If one of the second controller input end 162 and the third controller input end 163 receives a high voltage, it means the second linking lines 220 are not properly connected with two fourth linking lines 320. And the detecting system 100 will not detect the first connector 200 and the second connector 300.

When the detection module 150 detects the first linking lines 210 are all electrically connected to all the corresponding third linking lines 310 correspondingly, the detecting system 100 then connects the first signal line 170 with the second signal line 180. So the detecting system 100 can prevent the signal loss when the first linking lines 210 connect with the third linking lines 310 poorly.

While certain embodiments have been described and exemplified above, various other embodiments will be apparent to those skilled in the art from the foregoing disclosure. The present disclosure is not limited to the particular embodiments described and exemplified, and the embodiments are capable of considerable variation and modification without departure from the scope of the appended claims.

What is claimed is:

1. A detecting system for detecting the connection of two connectors, one connector comprising a plurality of first linking lines, and the other connector comprising a plurality of second linking lines, the detecting system comprising:
   a plurality of first detection switches and a plurality of pull-down resistors, each of the first linking lines being grounded via one of the first detection switches and one of the pull-down resistors in series, wherein terminals of the pull-down resistors connected to the first detection switches are defined as first detecting ends;
   a plurality of second detection switches and a plurality of pull-up resistors, each of the second linking lines being electrically coupled to a high potential via one of the second detection switches and one of the pull-up resistors in series; and
   a detection module with a threshold value preset therein, the detection module comprising a detecting module input end electrically connected to each first detecting end and a detecting module output end, the detection module configured for comparing the voltage value at the detecting module input end with the threshold value, and outputting a result via the detecting module output end to determine whether the first linking lines are electrically connected to the second linking lines respectively.

2. The detecting system as claimed in claim 1, wherein when the voltage value at the detecting module input end is higher than the threshold value, the first linking lines of the connector are all electrically connected to the second linking lines of the other connector.

3. The detecting system as claimed in claim 1, wherein when the voltage value at the detecting module input end is lower than the threshold value, at least one of the first linking lines of the connector is not electrically connected to the corresponding second linking line of the other connector.

4. The detecting system as claimed in claim 3, further comprising an alarm module electrically coupled to the detecting module output end and configured for alarming when the voltage value at the detecting module input end is lower than the threshold value.

5. The detecting system as claimed in claim 4, the alarm module can be a buzzer, an LED, and a display.

6. The detecting system as claimed in claim 4, wherein the alarm module can make a buzzing sound or turn on an LED or display words or image on a display.

7. The detecting system as claimed in claim 1, wherein each first detection switch further comprises a first detecting control end configured for making the first detection switches close when the two connectors are connected, each second detection switch further comprises a second detecting control end configured for making the second detection switches close when the two connectors are connected, and the detecting system further comprises a controller, the controller comprising a first controller input end electrically coupled to the detecting module output end and a first controller output end electrically coupled to the first detecting control ends and the second detecting control ends and configured for controlling the first and second detection switches to open and close based on the compared result outputted from the detection module.

8. The detecting system as claimed in claim 7, wherein if the voltage value of the detecting module input end is higher than the threshold value, the detection module outputs a high voltage to the detecting module output end, and the controller controls the first and second detection switches to open.

9. The detecting system as claimed in claim 7, wherein if the voltage value of the detecting module input end is lower than the threshold value, the detection module outputs a low voltage to the detecting module output end, and the controller controls the first and second detection switches to close.

10. The detecting system as claimed in claim 7, wherein the controller further comprises a second controller output end, and the second controller output end and the first controller output end output different signals at a same time, and the detecting system further comprises:
   a plurality of first connection switches, each first connection switch comprising a first connecting input end, a first connecting output end, and a first connecting control end, each first connecting input end being electrically connected to a signal source, each first connecting output end being electrically connected to a corresponding first detecting input end and a corresponding first linking line of the connector, each first connecting control end being electrically connected to a corresponding second controller output end; and
   a plurality of second connection switches, each second connection switch comprising a second connecting input end, a second connecting output end, and a second connecting control end, each second connecting input end being electrically connected to another signal source, each second connecting output end electrically connected to a corresponding second detecting output end and a corresponding second linking line of the connector, each second connecting control end electrically coupled to a corresponding second controller output end; the controller configured for controlling the first and second connection switches to open and close based on the compared result outputted from the detection module.

11. The detecting system as claimed in claim 10, wherein if the voltage value of the detecting module input end is higher than the threshold value, the detection module outputs a high voltage to the detecting module output end, and the controller controls the first and second connection switches to close.

12. The detecting system as claimed in claim 10, wherein if the voltage value of the detecting inputting module end is lower than the threshold value, the detection module outputs a low voltage to the detecting module output end, and the controller controls the first and second connection switches to open.

13. The detecting system as claimed in claim 1, wherein the value of each pull-down resistor is equal and the value of each pull-up resistor is equal.

14. The detecting system as claimed in claim 1, wherein, the first detection switches and the second detection switches are quick switches or bus switches.

15. The detecting system as claimed in claim 10, wherein the first connection switches and the second connection switches are quick switches or bus switches.

16. Two connector assemblies, one connector of the two connector assemblies comprising a plurality of first linking lines, and the other connector of the two connector assemblies comprising a plurality of second linking lines corresponding to the plurality of first linking lines, the two connector assemblies comprising:
   a detecting system for detecting the connection between the plurality of first linking lines and the plurality of second linking lines, the detecting system comprising:
   a plurality of first detection switches and a plurality of pull-down resistors, each of the first linking lines being grounded via one of the first detection switches and one of the pull-down resistors in series, wherein terminals of the pull-down resistors connected to the first detection switches are defined as first detecting ends;
   a plurality of second detection switches and a plurality of pull-up resistors, each of the second linking lines being electrically coupled to a high potential via one of the second detection switches and one of the pull-up resistors in series; and
   a detection module with a threshold value preset therein, the detection module comprising a detecting module input end electrically connected to each first detecting end and a detecting module output end, the detection module configured for comparing the voltage value at the detecting module input end with the threshold value, and outputting a result via the detecting module output end to determine whether the first linking lines are electrically connected to the second linking lines respectively.

17. The two connector assemblies as claimed in claim 16, wherein when the voltage value at the detecting module input end is higher than the threshold value, the first linking lines are all electrically connected to the second linking lines.

18. The two connector assemblies as claimed in claim 16, wherein when the voltage value at the detecting module input end is lower than the threshold value, at least one of the first linking lines is not electrically connected to the corresponding second linking line.

19. The two connector assemblies as claimed in claim 17, further comprising an alarm module electrically coupled to the detecting module output end and configured for alarming when the voltage value at the detecting module input end is lower than the threshold value.

20. The two connector assemblies as claimed in claim 16, wherein each first detection switch further comprises a first detecting control end configured for making the first detection switches close, each second detection switch further comprises a second detecting control end configured for making the second detection switches close, and the detecting system further comprises a controller, the controller comprising a first controller input end electrically coupled to the detecting module output end and a first controller output end electrically coupled to the first detecting control ends and the second detecting control ends and configured for controlling the first and second detection switches to open and close based on the compared result outputted from the detection module.

* * * * *